United States Patent [19]

Sumi et al.

[11] Patent Number: 5,198,067
[45] Date of Patent: Mar. 30, 1993

[54] APPARATUS FOR CONVEYING BASE WITH CROSSWISE BASE SLIDING DEVICE

[75] Inventors: Shigeo Sumi, Saitama; Fumio Hamamura, Kanagawa, both of Japan

[73] Assignee: Somar Corporation, Tokyo, Japan

[21] Appl. No.: 685,705

[22] Filed: Jan. 25, 1989

Related U.S. Application Data

[63] Continuation of Ser. No. 929,538, Nov. 12, 1986.

[30] Foreign Application Priority Data

Nov. 12, 1985 [JP] Japan ................................. 60-253433

[51] Int. Cl.⁵ ............................................. B32B 35/00
[52] U.S. Cl. .................................... 156/538; 156/552; 226/190; 226/194; 271/248; 271/250; 271/254
[58] Field of Search ................ 156/538, 552; 271/248, 271/254, 250; 226/190, 194

[56] References Cited

U.S. PATENT DOCUMENTS

| | | | |
|---|---|---|---|
| 3,142,429 | 7/1964 | Zirny | 226/190 X |
| 3,502,765 | 3/1970 | Spencer | 264/230 |
| 3,846,808 | 11/1974 | Whall | 226/190 X |
| 3,854,315 | 12/1974 | Winkler | 271/250 X |
| 4,228,994 | 10/1980 | Volpe | 271/254 X |
| 4,338,152 | 7/1982 | Del Bianco | 156/552 X |
| 4,657,239 | 4/1987 | Ikesue et al. | 271/248 X |

Primary Examiner—David A. Simmons
Assistant Examiner—M. Dixon
Attorney, Agent, or Firm—Sughrue, Mion, Zinn, Macpeak & Seas

[57] ABSTRACT

A conveying mechanism, particularly useful with a printed-circuit board laminator, in which the board is conveyed by several conveyor rollers having a small gap against several guide members, such as rollers, to accommodate the board and prevent its warping. A sliding device aligns the board as it is transported by the rollers.

18 Claims, 8 Drawing Sheets

APPARATUS FOR CONVEYING BASE WITH CROSSWISE BASE SLIDING DEVICE

This is a continuation of application Ser. No. 06/929,538, filed Nov. 12, 1986.

FIELD OF THE INVENTION

This invention relates to an apparatus for conveying a base (thin board used in later processing) and apparatus for conveying a base with a base sliding device for sliding the base in its widthwise direction.

BACKGROUND OF THE INVENTION

Printed circuit boards are used in electronic equipment, e.g., computers. In such boards, copper wiring or the like having a predetermined pattern is formed on one or both surfaces of an insulating base.

A printed circuit board of that sort is made in the following process steps. A laminate, consisting of a photosensitive resin layer (photoresist) and a translucent resin film (protective film) for protecting the photosensitive resin layer, is bonded onto a conductive layer provided on an insulating base through thermocompression bonding. The thermocompression bonding of laminates is conducted by a laminator on a mass-production basis. Then a wiring pattern mask is superposed on the laminate, and the photosensitive resin layer is exposed to light for a predetermined period of time thorough the wiring pattern mask and the translucent resin film. The photosensitive resin layer thus exposed to light is developed to form an etching mask pattern after the translucent resin film is peeled off by a peeling device. Unnecessary portions of the conductive layer are subsequently removed by etching and the remaining photosensitive resin layer is also removed to form a printed circuit board having a predetermined wiring pattern.

During the above process of manufacturing the printed circuit board, there is required the step of forming the laminate consisting of the photosensitive resin layer and the translucent resin film and bonding the laminate onto the insulating base. A roll of laminate continuously wound on a supply roll of a film laminator is pulled out and then cut into pieces corresponding in dimensions of the base to provide a laminate to be bonded thereto.

An apparatus for conveying the base to the thermocompression roller position is equipped with solid or hollow barlike conveyor rollers and pressure rollers. The base is held between the barlike conveyor rollers and the presser rollers and is conveyed as the rollers rotate. When the base is moved close to the thermocompression rollers, the base is slid by fixed crosswise guide members in a direction perpendicular to the conveyance direction (the width direction thereof) for registering it before being nipped between the thermocompression rollers.

When a base which readily tends to warp is conveyed, however, such crosswise guide members are incapable of accurately setting the center line or one end of the base to the center line or other predetermined position in the conveyance direction of the base conveying apparatus.

Because of the above problem, there may be installed a crosswise base sliding device (path deflector) for making the center line in the conveyance direction of the base or one end thereof coincide with the center line in the conveyance direction of the apparatus or the predetermined position. The front end of the base is detected with a base position detecting sensor to let the crosswise base sliding device start operation according to the detection signal, whereas the width of the base is detected with base width detecting sensors to let the crosswise base sliding device stop operation.

If the base is extremely thin, when the base is slid crosswise with the crosswise base sliding members and if the conveyor rollers and the presser rollers are joined to each other, however, the base, forced to move in the direction perpendicular to the conveyance direction with the crosswise base sliding members, will be pressed hard by the conveyor rollers and the presser rollers and not be readily movable because of frictional resistance between each roller and the base. Since the base is pressed hard with the crosswise base sliding members, the base portion thus pressed hard will bend and the problem is that the base cannot surely be slid in the direction perpendicular to the conveyance direction.

The presser rollers may be dispensed with to solve the above problem but, when the base is pressed with the sliding members without using the presser rollers, the base will yield to the pressure and will also bend. Consequently, the base cannot be slid crosswise.

The above-described and other problems to be solved by the present invention and novel features thereof will become manifest upon making reference to the detailed description which follows and the accompanying drawings.

SUMMARY OF THE INVENTION

A typical embodiment of the present invention disclosed hereby will briefly be outlined as follows.

The apparatus for conveying a base with a crosswise base sliding device according to the present invention comprises a device for sliding the base in a direction perpendicular to the conveyance direction thereof, conveyor rollers for conveying the base, and guide members for preventing the base from warping According to the invention, each conveyor roller and each guide member are arranged so that, in their portions respectively corresponding to a base passageway, a predetermined small gap is formed in between the top surface of the base being conveyed and the guide member According to the present invention, the conveyor rollers are driven to convey the base placed thereon while the base is guided by the guide members. When the base being conveyed is slid crosswise to set it in correct alignment, the conveyor rollers and the guide members prevent the base thus pressed crosswise from warping By conveying the base in such a controlled state, the base can be conveyed up to the thermocompression rollers in such a state that the center line in the conveyance direction of the base or one end thereof is made to conform to the center line in the conveyance direction of the apparatus for conveying a base or a predetermined position, with the crosswise base sliding members of a crosswise base sliding device deflecting the base. This operation can be performed readily and accurately without causing the base to bend.

The crosswise base sliding device may be so operated as to slide the base crosswise while conveying the base. Alternately the base can be stopped and then slid and then the conveying is restarted.

DETAILED DESCRIPTION OF THE PREFERRED EMBODIMENT

Figure 1:
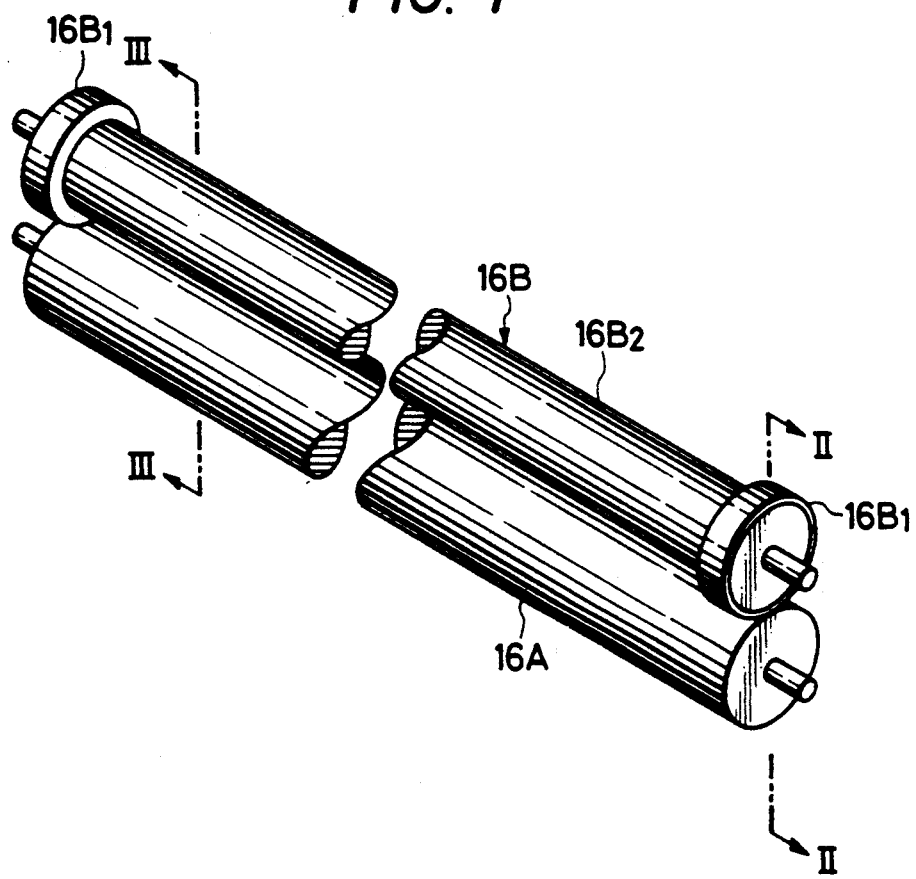
FIG. 1 is a perspective view showing the construction of rollers of an apparatus for conveying a base according to one embodiment of the present invention.

Referring now to the drawings, a description will be given of an embodiment of the present invention applied to an apparatus for conveying a base for a film laminator used for bonding a laminate consisting of a photosensitive resin layer and a translucent resin film onto a printed circuit board through thermocompression bonding.

In all drawings of the embodiment of the present invention, like reference characters designate like elements performing the like function respectively and the description thereof will be omitted.

Figure 9:
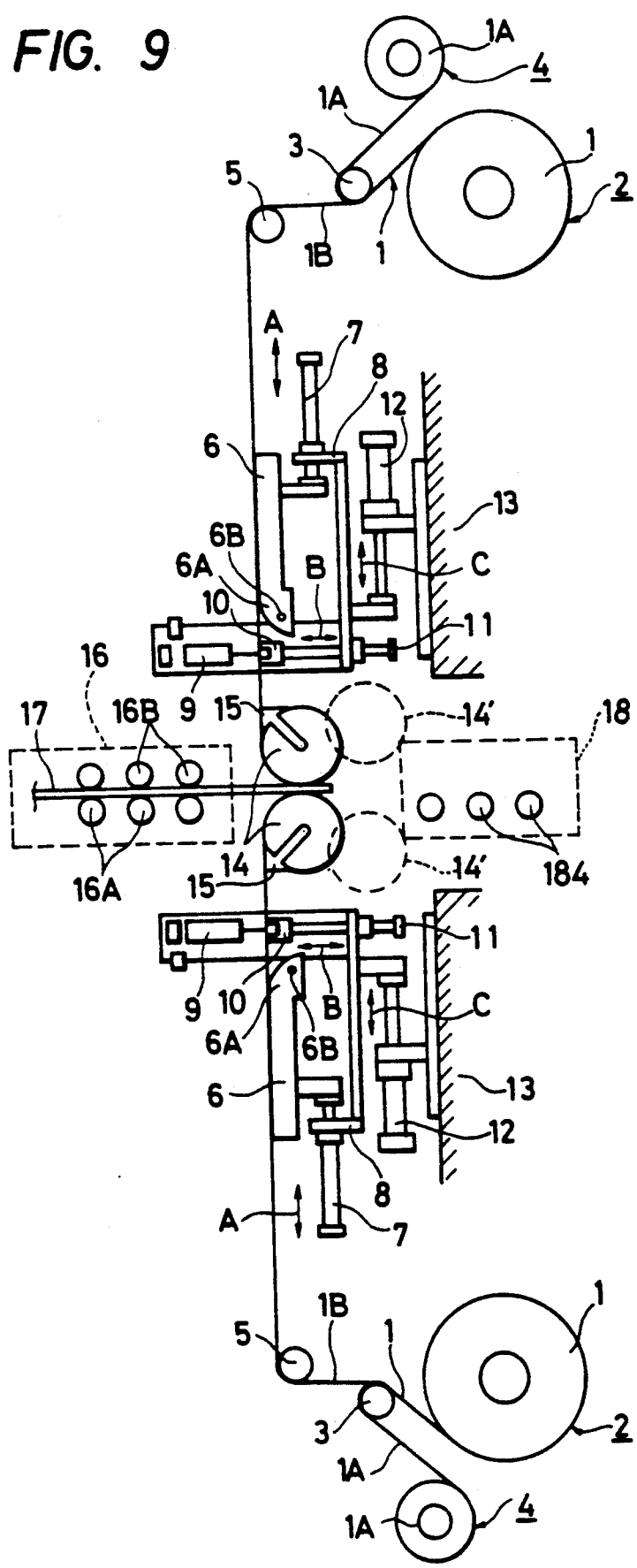
FIG. 9 is a side structural view of a film laminator related to the apparatus for conveying a base according to the present invention.

FIG. 9 is a schematic structural view of a film laminator employing an apparatus for conveying a base embodying the present invention.

In a film laminator shown in FIG. 9, a threelayer laminate 1 consisting of a photosensitive resin layer sandwiched between two translucent resin films is continuously wound on each supply roll 2 Note that similar elements are disposed above and below a printed circuit board base 17 to laminate both sides of the board base 17. The laminate 1 wound on the supply roll 2 is separated by a peeling roller 3 into a translucent resin film (protective film) 1A and a laminate 1B composed of the photosensitive resin layer with one side exposed (adhesive surface) and the other of the translucent resin films. The translucent resin film 1A thus separated is so arranged as to be rolled around a take-up roll 4.

The front end of the laminate 1B in the supply direction is grasped by a main vacuum plate 6 acting against a tension roller 5 providing proper tension. The main vacuum plate 6 is supported by a frame 8 through an air cylinder 7 whose position is variable in the direction of an arrow A. The main vacuum plate 6, together with the tension roller 5, is used to supply the laminate 1B to a base 17 without causing wrinkles in the laminate 1B An arcuate portion 6A at the front end of the main vacuum plate 6 contains a heater 6B and tentatively bonds the front end of the laminate 1B onto the conductive layer of the base 17 through thermocompression bonding, a roller 14 being displaced to a position indicated by a dashed line 14'.

A rotary cutter 9 installed close to the arcuate portion 6A is used to cut the continuous laminate 1B into a piece corresponding in dimensions to the base 17.

A subvacuum plate 10, used for having the front end of the laminate 1B thus cut off absorbed by the arcuate portion 6A, is positioned opposite to the rotary cutter 9. The subvacuum plate 10 is supported by the frame 8 through an air cylinder 11 whose position is variable in the direction of an arrow B.

The frame 8 for supporting the main vacuum plate 6 and the subvacuum plate 10 is supported by a frame 13 of the apparatus proper through an air cylinder 12 whose position is variable in the direction of an arrow C.

The laminate 1B whose front end was tentatively bonded by the arcuate portion 6A onto the conductive layer of the base 17 through thermocompression bonding is thoroughly bonded by a thermocompression roller 14, now disposed in a position indicated by a solid line.

The rear end of the laminate 1B cut to size by the rotary cutter 9 is guided by a triangular rotary vacuum plate 15 in such a manner as to prevent it from wrinkling and is bonded by the thermocompression roller 14.

The film laminator thus constructed works to bond the laminate 1B on the base 17 supplied with the conductive layer on both sides (or one side) of the insulating base conveyed by the base conveying apparatus 16 comprising the conveyor roller 16A and the guide member 16B. The laminate 1B is bonded onto the base 17 through thermocompression bonding so that the adhesive surface of the photosensitive resin layer whose translucent resin film 1A has been peeled off may stick to the surface of the conductive layer of the base 17. The base 17 with the laminate 1B bonded thereto through thermocompression bonding is carried out of the apparatus by a base discharging device 18.

Figure 8:
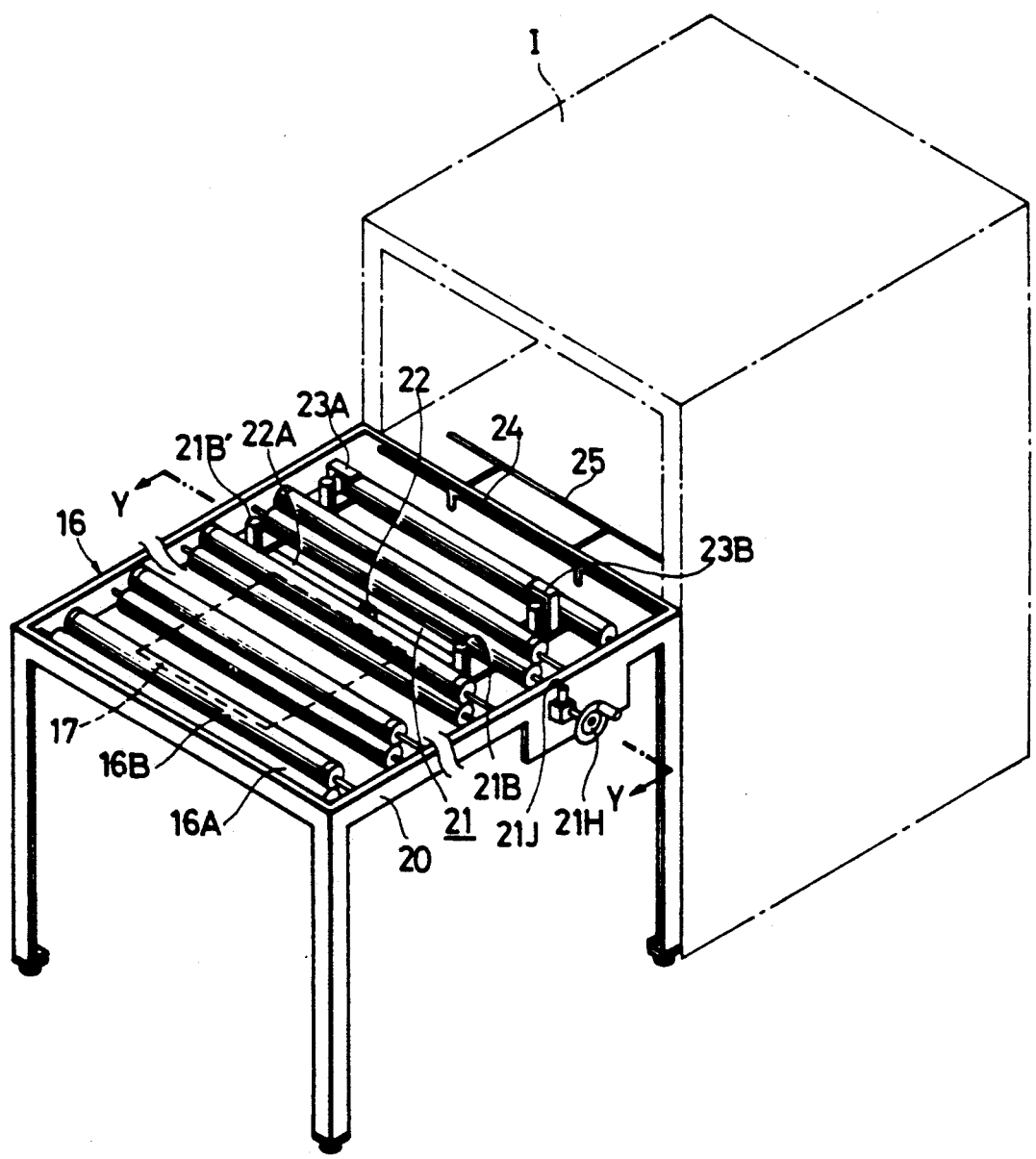
FIG. 8 is a perspective structural view of an apparatus for conveying a base according to the present invention.

FIG. 8 is a schematic structural view of the above base conveying apparatus 16. As shown in FIG. 8, the base conveying apparatus 16 is coupled to the film laminator I. As shown in FIGS. 1 and 8, each of a plurality of conveyor rollers 16A is formed with a fiberreinforced plastic roll member having the same diameter as each other and a plurality of conveyor rollers 16A are rotatably fitted to the frame 20 of the apparatus 16 proper. The plastic roll members may be solid or hollow but are preferably hollow. The plurality of conveyor rollers 16A are arranged a predetermined space apart to prevent the thin base 17 from drooping. Moreover, only every other one out of those conveyor rollers 16A is coupled to a driving source (not shown) However, either every other of the conveyor rollers 16A or all of them may be coupled to the driving source as occasion demands.

Figure 2:
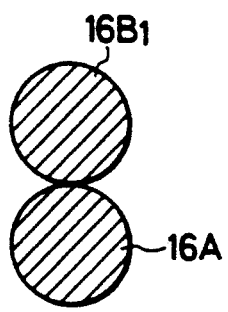
FIG. 2 is a sectional view taken on line II—II of FIG. 1.
Figure 3:
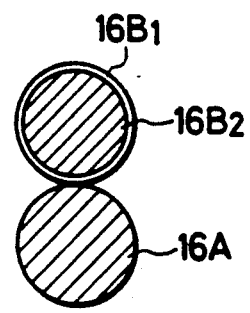
FIG. 3 is a sectional view taken on line III—III of FIG. 1.

As shown in FIGS. 8 and 9, the base 17 is mounted on the conveyor rollers 16A and conveyed while held and guided by the guide members 16B Every guide member 16B is formed with a roll member as in the case of the conveyor roller 16A to prevent the base 17 from being stopped with its end caught by the rollers when an extremely thin base is used which tends to readily wave or warp. As shown in FIGS. 1 through 3, both ends $16B_1$ of the guide member 16B are made slightly larger in diameter than the central portion $16B_2$ and they contact the corresponding conveyor roller 16A. In other words, the conveyor roller 16A and the guide roller 16B are arranged so that, in their portions respectively corresponding to the base passageway, a predetermined small gap is formed in between the top surface of the base 17 being conveyed and the guide member 16B. The guide members 16B are rotatably fitted to a frame 20. Although the guide members 16B shown in the drawings are not coupled to a driving source, they may be coupled thereto.

Both ends $16B_1$ of the guide members 16B are formed by, e.g., respectively fitting and fixing a replaceable ring or cap member to roll members with set screws. By changing the thickness of the ring or cap members, the gap between the conveyor roller 16A and the guide member 16B can be changed In other words, depending on the thickness of the base 17, the small gap between the top face of the base 17 and the portion $16B_2$ of the guide member 16B can be changed Moreover, the guide member 16B may be formed by forcing and fixing cap members with nicks on their periphery to the roll member.

Figure 4:
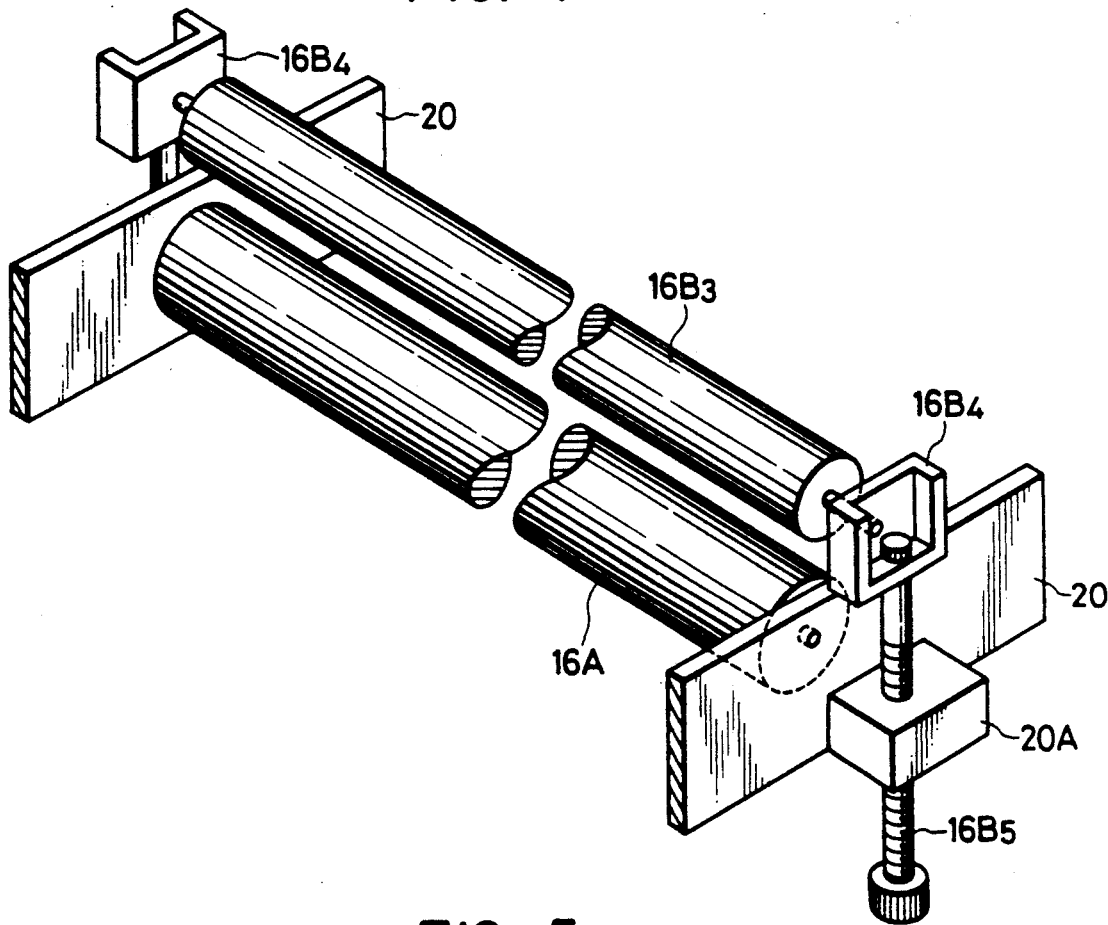
FIG. 4 is a perspective view showing the construction of another embodiment of the guide member according to the present invention.
Figure 5:
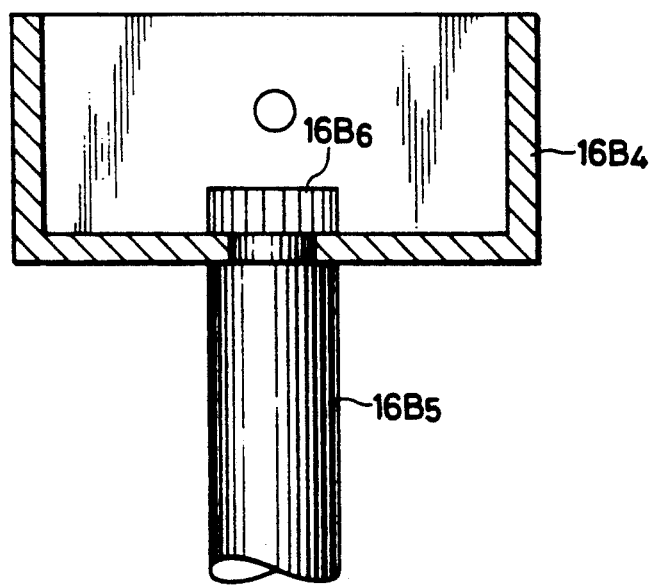
FIG. 5 is a sectional view showing the construction of the bearing means of the guide member of FIG. 4.

To provide a means for forming the predetermined gap between the conveyor roller 16A and the guide member 16B, a guide member or roller $16B_3$ being a roll member of uniform diameter, shown in FIG. 4, may rotatably be fitted to bearing members $16B_4$ to allow the bearing members $16B_4$ to move up and down by means of respective threaded bars $16B_5$. Each threaded bar $16B_5$ is, as shown in FIG. 5, rotatably fitted to the bearing member $16B_4$ with a set screw $16B_6$, screwed into the threaded portion of a support member 20A provided on the frame 20 of the base conveying apparatus 16 and supported thereby By rotating the threaded bars $16B_5$ thus arranged, the bearing members $16B_4$ of the guide member 16B are made movable, so that the size of that gap can be changed The guide member 16B may be such a rotary means that its contacting area with the base 17 is made smaller, e.g., its edge portion of the section on the center line is, as shown in FIG. 6, composed of a group of spherical shapes forming a sine curve.

Figure 6:
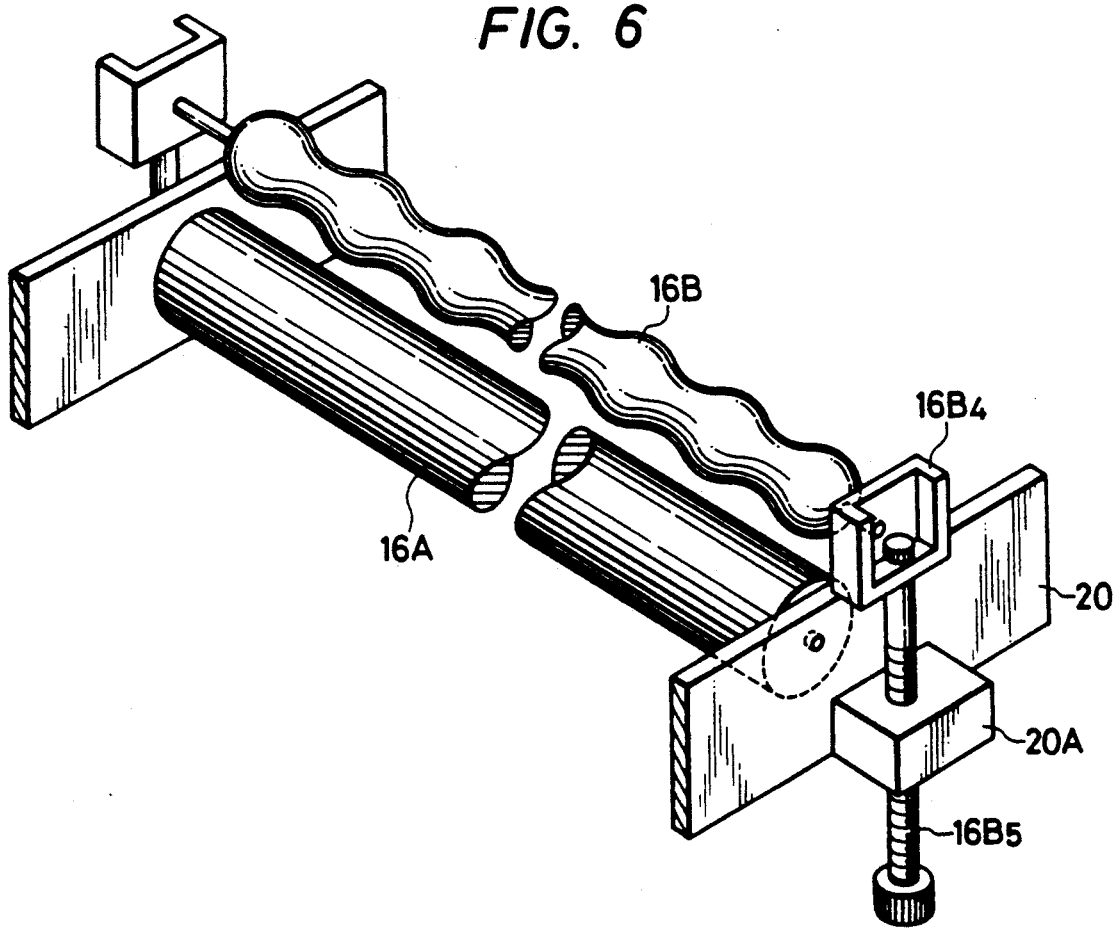
FIG. 6 is a perspective view showing the construction of still another embodiment of the guide member according to the present invention.
Figure 7:
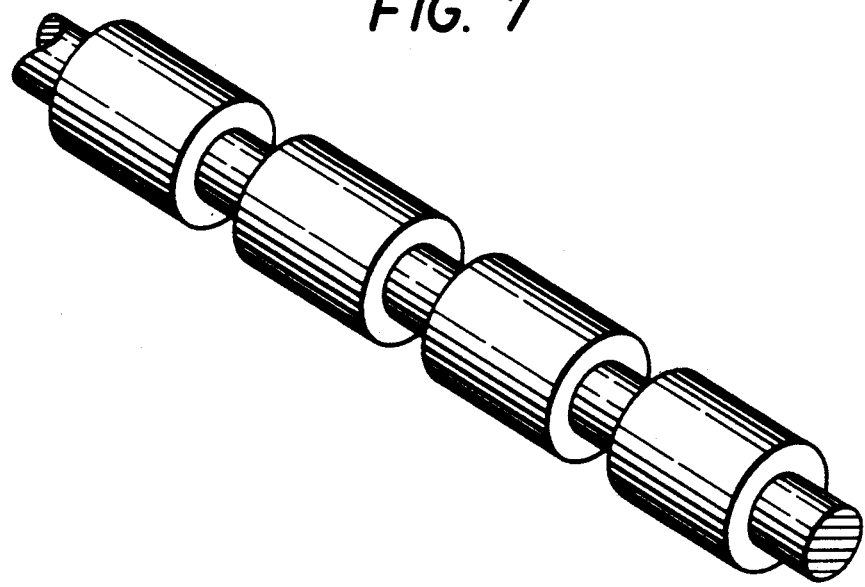
FIG. 7 is a perspective view showing the construction of another embodiment of the conveyor roller according to the present invention.

Moreover, the guide member 16B need not always be caused to rotate but may be formed with a nonrotatable means such as netted means, solid or hollow bar means and a piano wire Furthermore, the conveyor roller 16A may be formed with a corrugated surface as shown in FIGS. 6 and 7 to minimize its weight In other words, the guide member 16B should preferably be rotatable or be prepared from a member offering less frictional resistance, when the base 17 is slid in its widthwise direction while conveying it.

When the method of sliding the base in its widthwise direction while not conveying the base is employed, the guide member 16B need not rotate and allows to some extent for frictional resistance against the top surface of the base 17.

Figure 10:
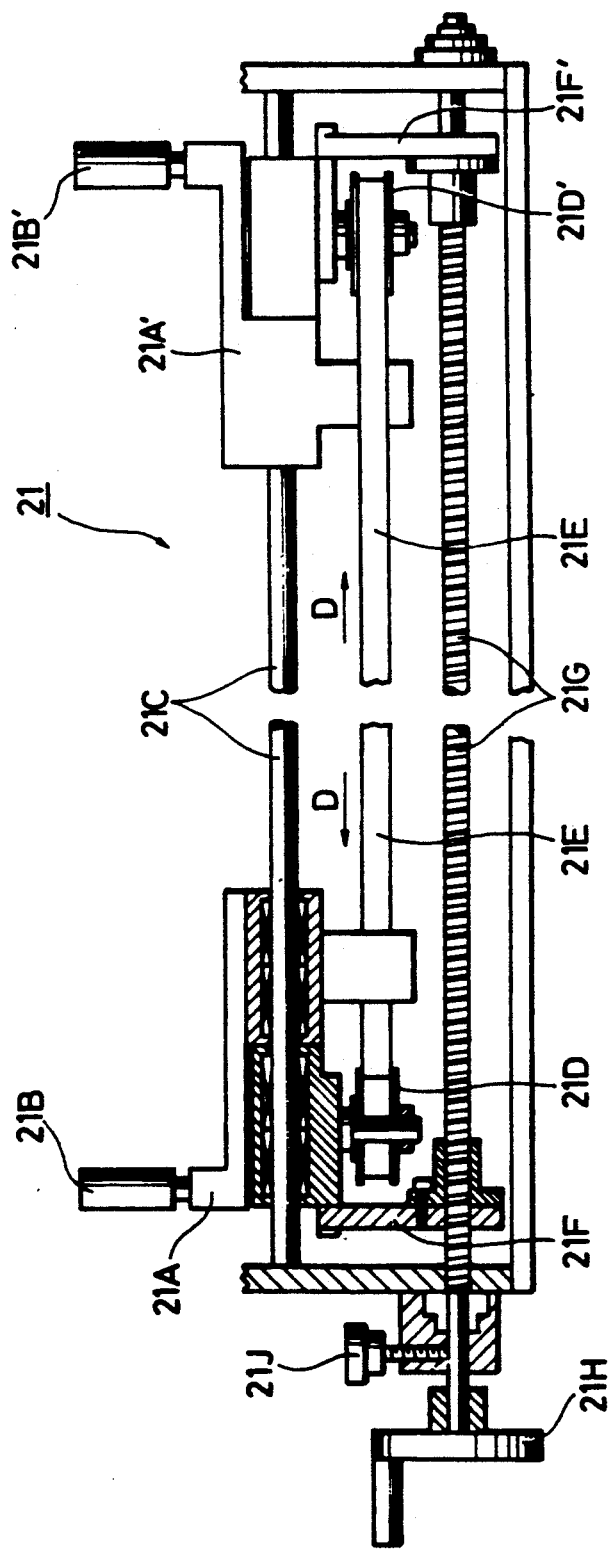
FIG. 10 is a sectional view taken on line Y—Y of FIG. 8.
Figure 11:
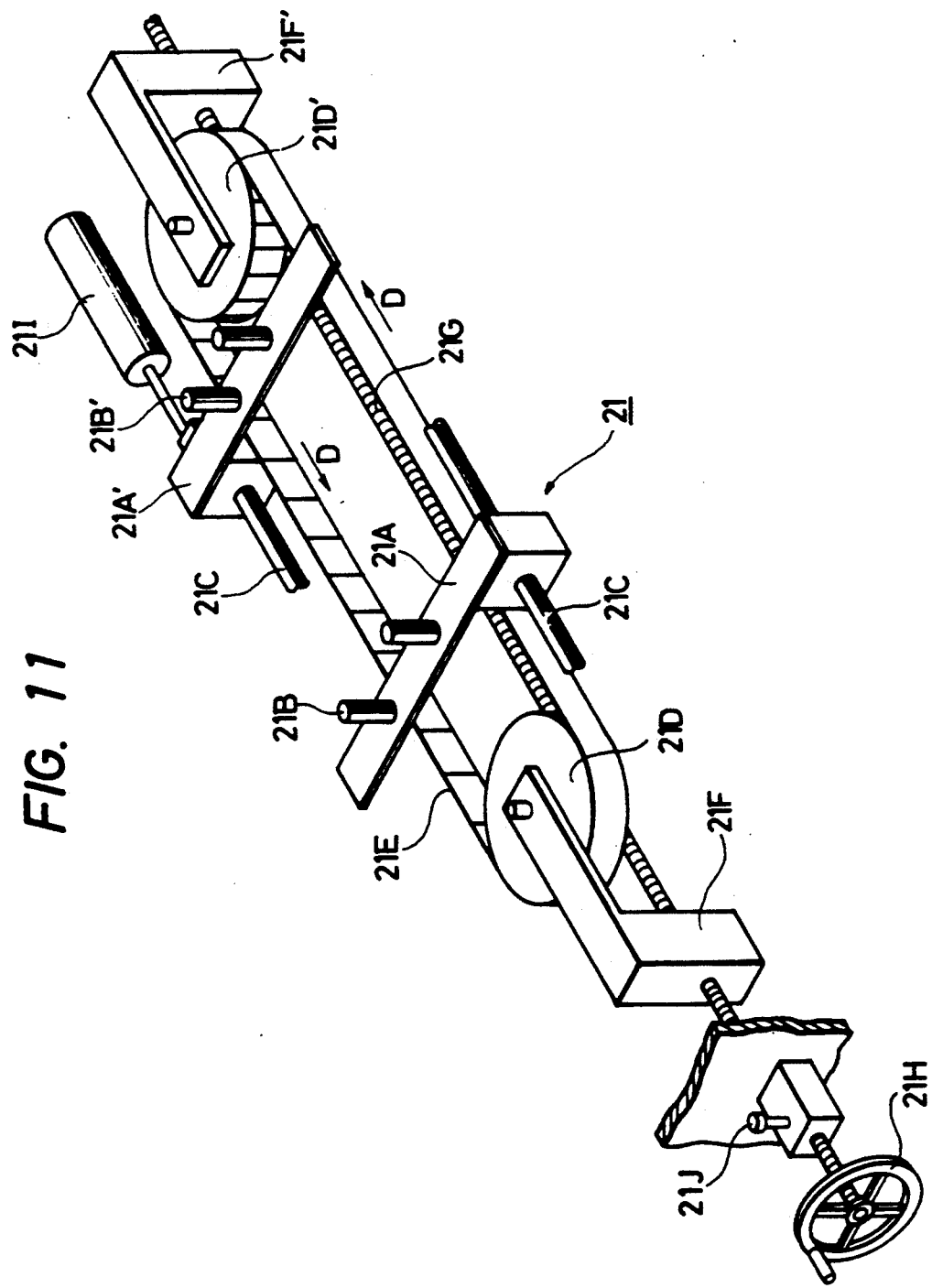
FIG. 11 is a perspective structural view of the crosswise base sliding device of FIG. 10.

As shown in FIG. 10 (sectional view taken on line Y—Y of FIG. 8) an FIG. 11 (perspective view), a crosswise base sliding device 21 is intended to make the centerline in the conveyance direction and the centerline in the conveyance direction of the base 17 coincide with each other. The crosswise base sliding device 21 is formed of crosswise base slide members 21B and 21B' supported by support members 21A and 21A'. The support members 21A and 21A' are slidably fitted to a support rod 21C. The support members 21A and 21A' are also fitted to an endless belt 21E wound on pulleys 21D and 21D' in such a manner that they are moved toward each other when the endless.. belt 21E moves in the direction of an arrow D. The support members 21A and 21A', coupled by the belt 21E, are caused to slide by an air cylinder 21I installed on the support member 21A'. The pulleys 21D, and 21D' are supported by respective inverted L-shaped support members 21F and 21F'. The inverted L-shaped support members 21F and 21F' mate with a threaded rod 21G, which is equipped with a handle 21H. By turning the handle 21H, the inverted L-shaped support members 21F and 21F' are together moved transversely while a fixed distance is held between them. The moving mechanism (fine adjustment mechanism) is intended to adjust the position of the crosswise base sliding device 21 to make the centerline in the conveyance direction or other position of the base 17 coincide with the centerline or other predetermined position of the laminate 1B for thermocompression bonding, i.e., to adjust the centerline of the base conveying apparatus 16 in case it shifts from the laminate 1B. The position of the crosswise base sliding device 21 is fixed with a screw 21J which fixes the rotation of the threaded rod 21G.

As shown in FIG. 8, a base position detecting sensor 22 detects the front (or rear) end of the moving base 17 and produces a signal for starting the driving of the crosswise base sliding member 21B and 21B' of the crosswise base sliding device 21. The base position detecting sensor 22 is fitted to the frame 20 through a support frame 22A. A reflective optical sensor is, for instance, employed as the base position detecting sensor 22.

Base width detecting sensors 23A and 23B mounted on the movable support members 21A and 21A' respectively detect both sides of the base 17. They produce signals for stopping the driving of the crosswise base slide members 21B and 21B' of the crosswise base sliding device 21. The base width detecting sensors 23A and 23B are installed on the inner sides of the crosswise base slide members 21B and 21B' close to the front end of the conveyance direction of the support members 21A and 21A'. In other words, the base width detecting sensors 23A and 23B are installed in such a position as to stop the crosswise base slide members 21B and 21B' when the centerline or a predetermined position of the base conveying apparatus 16. The control of the crosswise base sliding device 21 can be simply realized by causing the signal for stopping the driving of the crosswise base slide members 21B and 21B' to be produced slightly later than the time both sides of the base 17 are detected by the base width detecting sensors 23A and 23B using a delay circuit. Translucent type optical sensors can be used as the base width detecting sensors 23A and 23B.

The base 17 can thus be readily and accurately conveyed to the starting position of thermocompression bonding in such a state that the centerline in the conveyance direction or one side of the base 17 is made to coincide with the centerline or a predetermined position in the conveyance direction of the base conveying apparatus 16 without allowing the base 17 to bend by installing the crosswise base sliding device 21 for making the centerline in the conveyance direction or the one side of the base 17 coincide with the centerline or a predetermined position in the conveyance direction of the base conveying apparatus 16. The base position detecting sensor 22 starts the operation of the crosswise base sliding device 21 and the base width detecting sensors 23A and 23B stop the operation of the crosswise base sliding device 21.

The operation of the crosswise base sliding device 21 may be conducted while the base 17 is being conveyed or not.

Figure 12:
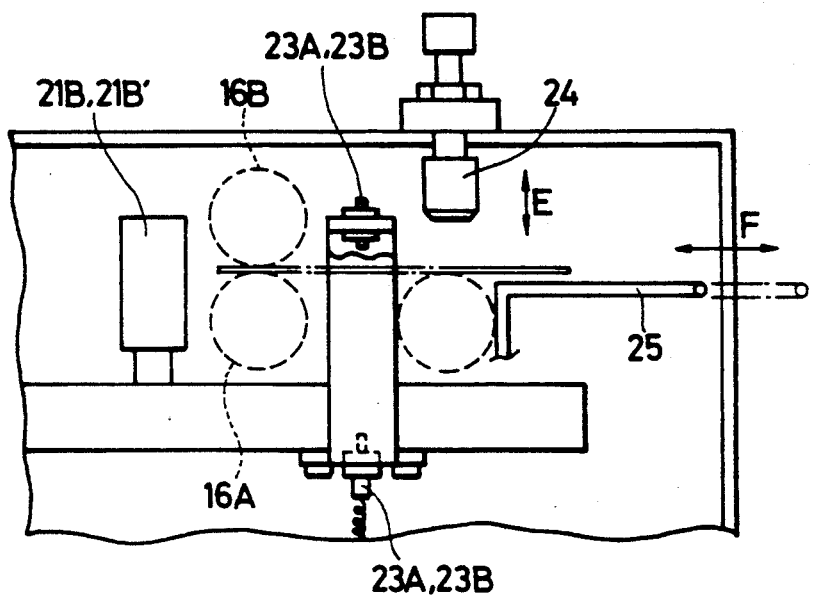
FIG. 12 is a side view showing the construction of the base breadth detecting sensor, the holding member and the base support member shown in FIG. 8.
Figure 13:
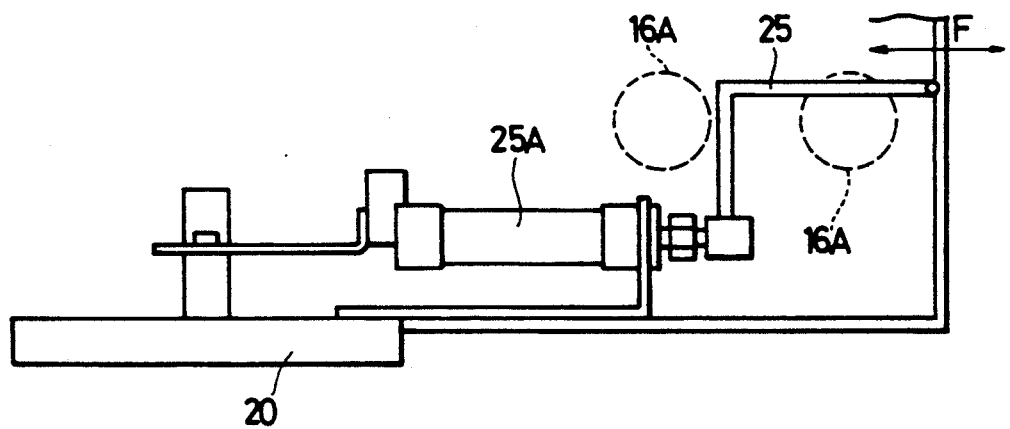
FIG. 13 is a side view showing the construction of the base support member of FIG. 8.

A base holding member 24 shown in FIG. 8 fixes and holds the base 17 so that it may not drop when the base 17 reaches the starting position of the thermocompression bonding As shown in the side view of FIG. 12, the base holding member 24 is fitted to the frame 20 and is moved by an air cylinder and a spring (not shown) in the direction of an arrow E Moreover, a base support member 25 projects in the direction of an arrow F interlockingly or not with the operation of driving the base holding member 24. As shown in FIG. 13 (side view) the control of the base support member 25 in the direction of the arrow F is conducted by an air cylinder 25A fitted to the frame 20. The operation of the base holding member 24 or base support member 25 is controlled by the drivestarting or drive-stopping signal produced by a base position detecting sensor (not shown).

The base holding member 24 and the base support member 25 thus installed support the base 17 to prevent the base 17 from dropping when it reaches the starting position of the thermocompression bonding and are capable of holding it in position until the thermocompression rollers 14 vertically sandwich it therebetween, so that the laminate 1B is accurately bonded onto the base 17 through thermocompression bonding.

The operation of the apparatus for conveying a base according to the present invention will briefly be described.

In FIG. 8, the base 17 is conveyed toward the thermocompression rollers 14 by driving predetermined ones of the conveyor rollers 16A. When the front end of the base 17 thus conveyed is detected by the base position detecting sensor 22, the crosswise base sliding device 21 The crosswise base sliding device 21 operates so as to the centerline or one end of the base 17 coincide with the centerline or a predetermined position of the conveying apparatus 16 by using the crosswise base slide members 21B and 21B'. When both sides of the base are then detected by the base width detecting sensors 23A and 23B, the operation of the crosswise base sliding device 21 is stopped by the drive-stopping signal. The base 17 is consequently conveyed to the position of thermocompression bonding in such a state that the centerline in the conveyance direction or one side of the base 17 coincides with the centerline in the conveyance direction or the predetermined position of the base conveying apparatus 16. At this time, the conveyor rollers 16A are stopped by the base position detecting sensor (not shown) and the holding member 24 moves down and makes the base 17 immovable. The base support member 25 simultaneously projects to support and prevent the base 17 from dropping. Then as shown in FIG. 9, the thermocompression rollers 14 move toward the left to the base 17 and sandwich the base 17 through the laminate 1B, already tentatively thermocompression bonded. The thermocompression rollers 14 and the conveyor rollers 16A are driven so that the laminates 1B are bonded onto the base 17 through thermocompression bonding.

Although the present invention has been described in its preferred form with a certain degree of particularity, it is needless to say understood that the invention is not limited to the specific embodiments thereof and modification of the invention is possible within its spirit and scope as set out in the accompanying claims.

Although various embodiments of the guide member 16B were described above, any other guide members capable of preventing the base 17 from warping or bending are usable, e.g., both ends 16B$_1$ of the guide member 16B may be prepared from the same material and formed in one bodies, instead of being constructed of separable ring or cap members fitted into a bar member, respectively. Furthermore, the surface of the guide member 16B may be less wear resistant so as to make the base 17 slide smoothly.

The present invention is also applicable to the rollers of an apparatus for conveying a base for use in a film peeling machine.

As set forth above, the conveyor rollers and the guide members are so arranged that, in their portions corresponding to the base conveyance passage, the predetermined small gap is formed in between the top surface of the base being conveyed and the guide member, whereby the base can be conveyed to the thermocompression starting position readily and accurately in such a state that the center line in the conveyance direction of the base or one end thereof is made to coincide with the center line in the direction of the apparatus for conveying a base or the predetermined position, without causing the base to warp.

We claim:

1. An apparatus for conveying a board from an input position to a holding position comprising:
   conveying means for transporting said board in a conveying direction toward said holding position, said conveying means comprising conveyor rollers for conveying said board in the conveying direction, said conveyor roller shaving a rotation axis extending horizontally and transversely to the conveying direction, and guide members provided above said conveyed board, said guide members extending horizontally and transversely across said conveyed board to the conveying direction, and aligned with opposed respective ones of said conveyor rollers;
   means for forming a predetermined gap between said guide members and said conveyor rollers for preventing warping of the board conveyed on said conveyor rollers and held between said conveyor rollers and said guide members in said predetermined gap, said predetermined gap being correlated with a thickness of said board; and
   a crosswise base sliding means disposed in a path of said board along said conveying means between said input position and said holding position for sliding said board transversely to the conveying direction to thereby aligning a predetermined position of said board with another predetermined position of said apparatus as said board is being transported by said conveying means,
   said base sliding means comprising a threaded rod extending generally perpendicular to the conveying direction of said board and lying in a plane generally parallel to a plane of said board, first and second pulley support members threadedly engaged with said threaded rod to move together in the same direction perpendicular to said conveying direction when said rod is rotated, a pulley rotatably mounted on each of said pulley support members, an endless belt entrained between said pulleys, a support rod mounted generally parallel to said threaded rod, a pair of slide member supports slidably mounted on said support rod and connected on opposite sides to said endless belt so that said slide member supports move toward or away from one another as said endless belt is moved, and a pair of slide members mounted on respective ones of said slide members supports and disposed in a said path of said board.

2. An apparatus as recited in claim 1, wherein said guide members comprise rotary roll members.

3. An apparatus as recited in claim 2, wherein said gap forming means comprises radially projecting annular portions projecting from said rotary roll members at opposite ends thereof, said radially projecting annular portions contacting said conveyor roller axially aligned therewith to thereby define said predetermined gap.

4. An apparatus as recited in claim 3, wherein said annular portions are removable from said rotary roll members.

5. An apparatus as defined in claim 1, wherein said guide members are non-rotary.

6. An apparatus as defined in claim 1, wherein said sliding device comprises at least two members movable toward each other in synchronism for approaching opposing sides of said board.

7. An apparatus as defined in claim 6, wherein said sliding device comprises two pairs of said movable members, said pairs being separated by a conveyor roller and a guide member and being aligned with said conveyance direction.

8. An apparatus as defined in claim 7, further comprising means for laminating a laminating sheet onto said board disposed down stream from said conveyor rollers and said sliding device along said conveying direction.

9. An apparatus as recited in claim 1, further comprising holding members for holding said guide members and varying the amount of said predetermined gap between said guide members and said guide rollers.

10. An apparatus as recited in claim 1, further comprising supporting members for supporting said conveyor rollers and said holding members, and means for mounting said holding members for movement with respect to said supporting members, towards and away from said conveyor rollers.

11. An apparatus as recited in claim 10, wherein said holding members rotatably mount said guide members for rotation about their axes.

12. An apparatus as recited in claim 11 wherein said guide members each comprise a group of axially linked spherical shapes forming a sine curve.

13. An apparatus as recited in claim 12 wherein said conveyor rollers each comprise a plurality of radially projecting annular portions provided at spaced intervals along the axis of each said conveyor roller.

14. An apparatus as recited in claim 1, wherein the predetermined position of said board is a centerline of said board and the other predetermined position of said apparatus.

15. An apparatus as recited in claim 1, further comprising:
means connected to one of said slide members for moving both said side members through said endless belt;
board position detecting means for detecting a presence of a board and instructing said moving means to start moving said slide members; and
board width detecting means for detecting that the predetermined position of said board coincides with the other predetermined position of said apparatus and stopping said moving means.

16. An apparatus as recited in claim 15, wherein said board position detecting means is disposed to detect a front end of said board.

17. An apparatus as recited in claim 1, further comprising a board holding member and a board supporting member for fixing said board in position at said holding position, said board holding member being mounted above said board at said holding position and being movable perpendicular to a plane of said board, and said board supporting member being moveable in a direction parallel to said plane of said board and supporting said board from below.

18. An apparatus as recited in claim 17, further comprising an air cylinder connected to one of said slide member supports for moving both said slide member supports through movement of said endless belt.

* * * * *